US008698294B2

(12) United States Patent
Camacho et al.

(10) Patent No.: US 8,698,294 B2
(45) Date of Patent: Apr. 15, 2014

(54) INTEGRATED CIRCUIT PACKAGE SYSTEM INCLUDING WIDE FLANGE LEADFRAME

(75) Inventors: Zigmund Ramirez Camacho, Singapore (SG); Jose Alvin Caparas, Singapore (SG); Arnel Trasporto, Singapore (SG); Jeffrey D. Punzalan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 798 days.

(21) Appl. No.: 11/307,129

(22) Filed: Jan. 24, 2006

(65) Prior Publication Data

US 2007/0170570 A1    Jul. 26, 2007

(51) Int. Cl.
*H01L 23/02*    (2006.01)

(52) U.S. Cl.
USPC ............. 257/686; 257/E23.033; 257/E23.037

(58) Field of Classification Search
USPC ........... 257/E23.052, E23.124, E23.126, 686, 257/692, 666, 684, 735, 790, 676, 787, 257/E23.033, E23.037
See application file for complete search history.

(56) References Cited

U.S. PATENT DOCUMENTS

| 5,157,478 | A * | 10/1992 | Ueda et al. ................. 257/796 |
| 6,081,029 | A * | 6/2000 | Yamaguchi ................. 257/718 |
| 6,190,944 | B1 * | 2/2001 | Choi ........................... 438/109 |
| 6,208,020 | B1 * | 3/2001 | Minamio et al. ............. 257/684 |
| 6,255,740 | B1 * | 7/2001 | Tsuji et al. .................. 257/792 |
| 6,380,624 | B1 * | 4/2002 | Hung .......................... 257/723 |
| 6,597,059 | B1 * | 7/2003 | McCann et al. ............. 257/673 |
| 6,624,522 | B2 | 9/2003 | Standing et al. ............ 257/782 |
| 6,661,083 | B2 * | 12/2003 | Lee et al. .................... 257/676 |
| 6,753,597 | B1 * | 6/2004 | Crowley et al. ............. 257/676 |
| 6,767,820 | B2 | 7/2004 | Standing et al. ............ 438/614 |
| 6,781,243 | B1 * | 8/2004 | Li et al. ........................ 257/777 |
| 6,838,761 | B2 | 1/2005 | Karnezos ..................... 257/685 |
| 7,211,879 | B1 * | 5/2007 | Yang et al .................... 257/666 |
| 7,245,007 | B1 * | 7/2007 | Foster ......................... 257/678 |
| 2002/0113304 | A1 * | 8/2002 | Doh et al. .................... 257/686 |
| 2002/0182841 | A1 * | 12/2002 | DiStefano et al. ........... 438/611 |
| 2003/0001252 | A1 * | 1/2003 | Ku et al. ...................... 257/686 |
| 2004/0067606 | A1 | 4/2004 | Fehr et al. ................... 438/109 |
| 2004/0227250 | A1 * | 11/2004 | Bolken et al. ............... 257/777 |
| 2005/0012193 | A1 * | 1/2005 | Kameyama et al. ......... 257/678 |
| 2005/0253280 | A1 * | 11/2005 | Katou et al. ................. 257/782 |
| 2006/0186514 | A1 * | 8/2006 | Shim et al. .................. 257/666 |
| 2006/0197207 | A1 * | 9/2006 | Chow et al. ................. 257/686 |
| 2007/0108569 | A1 * | 5/2007 | Bathan et al. ............... 257/676 |
| 2007/0114650 | A1 * | 5/2007 | Punzalan et al. ............ 257/690 |

* cited by examiner

*Primary Examiner* — Wael Fahmy
*Assistant Examiner* — Sarah Salerno
(74) *Attorney, Agent, or Firm* — Ishimaru & Associates LLP

(57) ABSTRACT

An integrated circuit package system provides a known good die module by providing a leadframe, providing a first die, attaching the first die to the leadframe, and encapsulating at least the first die. A second die is attached to the known good die module such that the known good die module is a substrate for the second die. The second die is electrically attached to the known good die module. At least the second die is additionally encapsulated.

8 Claims, 8 Drawing Sheets

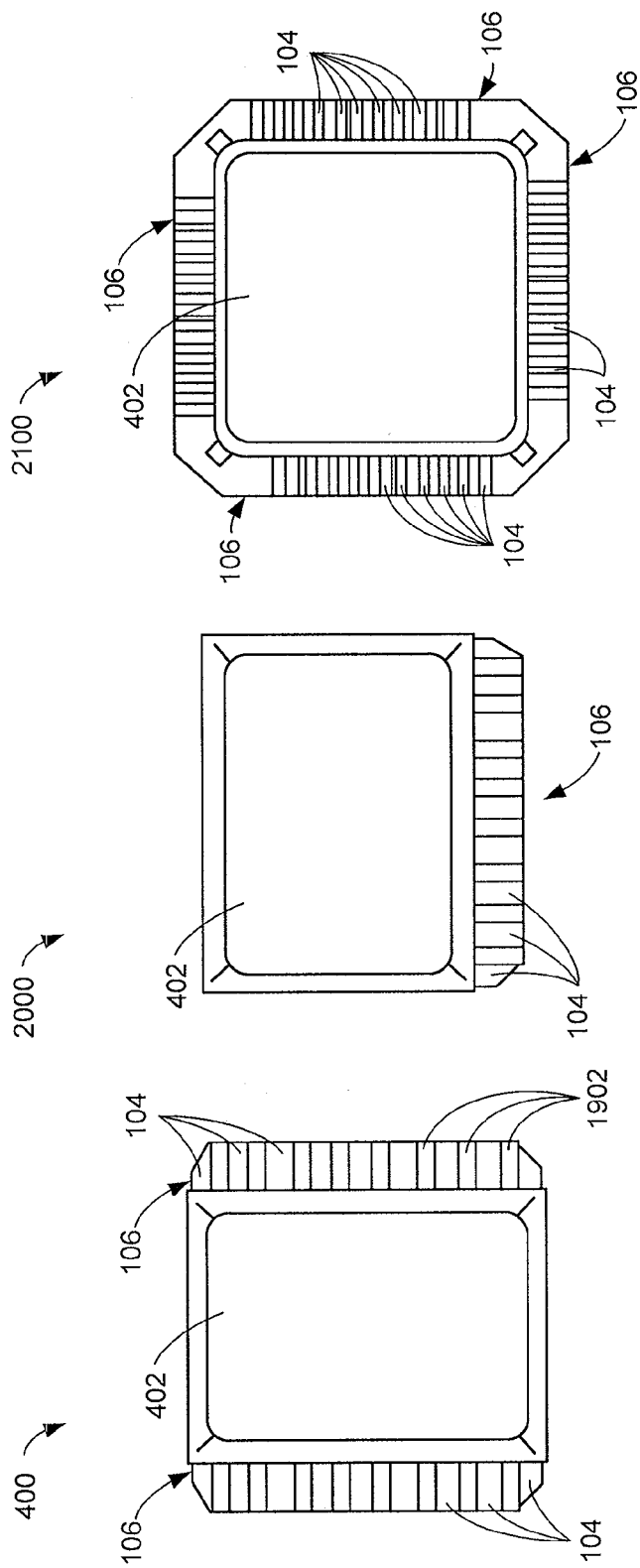

INTEGRATED CIRCUIT PACKAGE SYSTEM INCLUDING WIDE FLANGE LEADFRAME

TECHNICAL FIELD

The present invention relates generally to semiconductor packages, and more particularly to a system for thin package-in-package configurations.

BACKGROUND ART

An integrated circuit ("IC") chip or die is a small electronic device formed on a semiconductor wafer, such as a silicon wafer. A leadframe is a metal frame that usually includes a paddle that supports an IC die after it has been cut from the wafer. The leadframe has lead fingers that provide external electrical connections for the IC die.

It is conventional in the electronics industry to encapsulate one or more semiconductor devices, such as IC dies, into semiconductor packages. These semiconductor packages protect the IC dies from environmental hazards and assist in electrically and mechanically attaching the IC dies to other electronic devices.

Commonly, such semiconductor packages include metal leadframes for supporting IC dies. An IC die is bonded to the die paddle region, formed centrally on the leadframe. Conductors such as bond wires electrically connect pads on the IC die to individual leads or lead fingers of the leadframe. That is, the IC die is attached to the die paddle, and then bonding pads of the IC die are connected to the lead fingers via wire bonding or flip die bumping to provide the external electrical connections. A hard plastic or epoxy encapsulating material ("encapsulant") is then applied to form the exterior of the semiconductor package, covering the bond wires, the IC die, and (when present) other associated components.

Although the leadframe is the central supporting structure of the semiconductor package, only a portion of the leadframe is completely surrounded by the plastic encapsulant. Other portions of the leadframe are exposed externally or extend beyond the semiconductor package to electrically connect and physically support the semiconductor package externally.

Once the IC dies have been produced and encapsulated in semiconductor packages, as described above, they may be used in a wide variety of electronic devices. The number and variety of electronic devices utilizing semiconductor packages has grown dramatically in recent years.

Electronic devices that utilize semiconductor packages typically include a motherboard on which a significant number of such semiconductor packages are secured to provide multiple electronic functions. The semiconductor packages thus support the IC dies on the motherboards and transmit electrical signals from the IC dies to the motherboards.

Not only is the use of semiconductor packages widespread, but the ever-reducing size and cost of electronic devices puts continuous pressure on the need for smaller, less costly semiconductor packages. Also, for high bandwidth radio frequency ("RF") devices and high operating frequency devices, there is a continuing need for shorter and shorter electrical paths inside semiconductor packages.

Thus, with continually increasing consumer demands and continuing progress in semiconductor technologies, electronic devices are manufactured in ever-increasing complexity, in ever-reduced sizes, and at ever-reduced costs. Accordingly, not only are IC dies more and more highly integrated, but semiconductor packages are more and more highly miniaturized, with ever-increasing levels of semiconductor package mounting density.

The requirement for such high performance, small size, thin semiconductor packages has resulted in the development of semiconductor packages having structures in which leads are exposed on the bottom of the encapsulant at respective lower surfaces thereof. Depending on the package type, the external leads may be used as-is, such as in a thin small outline package ("TSOP"), or further processed, such as by attaching spherical solder balls for a ball grid array ("BGA"). These various types of connection terminals allow the IC die to be electrically connected with other circuits, such as those on a printed circuit board ("PCB").

With increasingly smaller die and package sizes throughout the semiconductor industry, there is a pressing need for improved methods and structures to meet and match the ever-reducing external form factors (external package sizes, configurations, and thicknesses). A particular need exists to reduce the thicknesses of package-in-package ("PIP") configurations. A concurrent need exists to simplify such PIP configurations. A great and continuing need at the same time is to reduce the costs thereof. Along with these pressing requirements is the need for greater versatility along with improved PIP reliability.

In view of the ever increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, improve performance, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system. A known good die module is provided by providing a leadframe, providing a first die, attaching the first die to the leadframe, and encapsulating at least the first die. A second die is attached to the known good die module such that the known good die module is a substrate for the second die. The second die is electrically attached to the known good die module. At least the second die is additionally encapsulated.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 19 is a top view of the structure of FIG. 4;

FIG. 20 is a view of a single-sided known good die module with a wide flange according to another embodiment of the present invention;

FIG. 21 is a view of a four-sided known good die module with wide flanges on all four sides thereof, according to still another embodiment of the present invention.

BEST MODE FOR CARRYING OUT THE INVENTION

Figure 1:
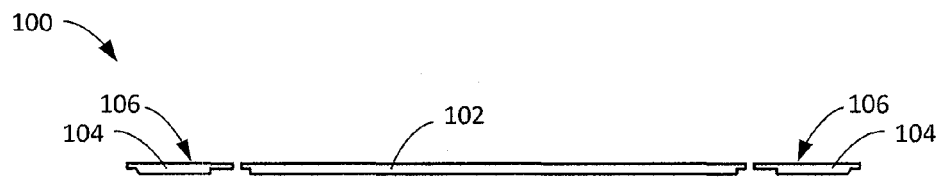
FIG. 1 is a view of a leadframe according to an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the invention are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "on", "above", "below", "bottom", "top", "side"(as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

As will be explained more particularly hereinbelow, the present invention provides a system for thin package-in-package ("PIP") configurations. By utilizing a leadframe that has a wide flange, a PIP assembly process is enabled that produces a known good die ("KGD") module or a known good unit ("KGU") that does not require a separate substrate for attaching thereto. Instead, the KGD is a substrate on its own account. The wide flange KGD configurations according to the present invention are thus thinner, less complicated, and less costly. Additionally, the wide flange of the leadframe enables the KGD module itself to be and to serve as a substrate for an additional die. This readily and unexpectedly facilitates further device integration (e.g., PIP assemblies and configurations) in an economical, compact, and particularly thin package form factor.

In one embodiment, the present invention provides a quad leadless package ("QLP") for use as a KGD for PIP applications. The wide flange distance dimension provides, as appropriate, for making the flange area wire bondable and surface mountable for PIP applications. Embodiments of the invention may then be configured in a variety of thin, high-density form factors. For example, in one embodiment, a QLP outline design is optimized for use as a KGU in PIP applications, the optimized design having a wire-bondable and/or surface-mountable wide flange area.

Referring now to FIG. 1, therein is shown a leadframe 100 according to an embodiment of the present invention. The leadframe 100 includes a central die-attach pad ("DAP") 102. On the periphery of the DAP 102 are lead fingers 104. The lead fingers 104 are elongated, and are supported on a wide flange 106 (see FIGS. 19-21) at the periphery of the DAP 102 to enable and support wire bonding as further described below.

A conventional or standard flange, on the other hand and as known and practiced in the art (e.g., in a QLP package), does not support wire bonding. That is, the flange on a conventional package generally serves just to define the trimming line during package punch-singulate. Any exposed leads on the top surface are only incidental. In fact, such exposed leads are generally unsuitable for wire bonding due to lack of space, lack of good surface finish, and irregular flange lead edges resulting from trimming operations. Such irregular edges cause more space to be needed, if wire bonding is desired, to avoid bonding onto the irregular edges. Additionally, attempts to wirebond onto the narrow space available on a standard-sized flange cause wire bonding setup and production tolerance difficulties that render such a configuration inefficient, uneconomical, and uncompetitive. Thus, as indicated, conventional and standard flanges do not support wire bonding thereto.

For example, a standard punched QLP has a flange width of only 0.125 mm±0.05 mm. For a lead finger to be bondable with wires, it has been discovered that the width has to be at least about 3 times that (using a conservative wire bonding machine). Even with finer wire bonding capability (usually more expensive), an additional 50% more flange width has been discovered to be desirable just for wire bonding. Still more flange width is then necessary to accommodate molding of the package.

As used herein, the term "wide flange" thus refers generally to a distance dimension substantially greater than the standard dimension for a given package size, e.g., from approximately 0.10 mm to 50% of the finished package size. This larger, wide flange distance dimension has been found to be particularly advantageous for KGUs and KGD configurations and embodiments such as disclosed and described herein. However, it will be understood that these dimensions are exemplary and that other increased flange proportions may be used according to the teachings of the present invention when appropriate and advantageous.

Figure 2:
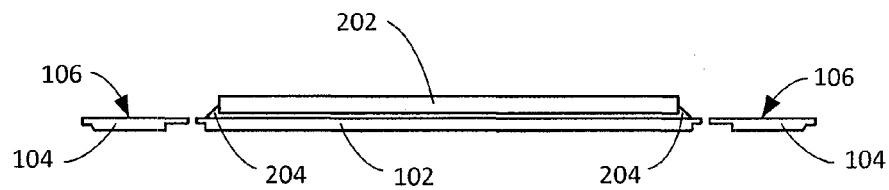
FIG. 2 is the structure of FIG. 1 after attachment thereto of a die.

Referring now to FIG. 2, therein is shown the structure of FIG. 1 following adhesive attachment thereto of a die 202 to the DAP 102 by means of an adhesive 204. The adhesive 204 may be any appropriate adhesive, such as an epoxy adhesive commonly used for this purpose.

Figure 3:
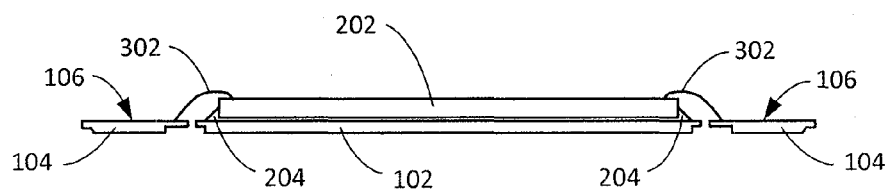
FIG. 3 is the structure of FIG. 2 after attachment thereto of bond wires between the die and lead fingers on the leadframe.

Referring now to FIG. 3, therein is shown the structure of FIG. 2 following attachment thereto of bond wires 302 between the die 202 and the lead fingers 104.

Figure 4:
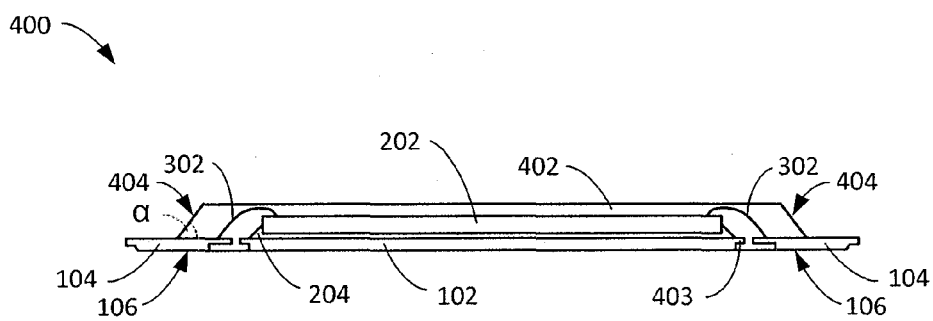
FIG. 4 is the structure of FIG. 3 after encapsulation and completion as a known good die module.

Referring now to FIG. 4, therein is shown the structure of FIG. 3 following completion as a KGD module 400. An encapsulant 402 has been used to encapsulate the die 202 and the bond wires 302. Portions of the DAP 102, the wide flange 106, and the lead fingers 104 are also encapsulated leaving an elongated portion of the lead fingers 104 exposed. The DAP 102 is also shown having a DAP extension 403 encapsulated in the encapsulant 402. The encapsulant 402 may be any plastic or epoxy material commonly known and used for this purpose.

The KGD module 400 is particularly advantageous because it can be tested and certified to contain a "good" die that has good bond wire connections. Further, the tested KGD module 400 is protected and stabilized by the encapsulant 402.

Another important advantage according to the present invention is that the wide flange 106 that is wire bondable, and the structural shape of the KGD module 400, provide for connecting directly to a circuit board, or incorporating into a PIP configuration, and so forth, as described further herein. The lead fingers 104 that are exposed on the bottom of the KGD module 400 provide electrical connections for the KGD module 400 and can also be employed to physically secure it to a circuit board or other substrate (e.g., by means of surface mount technology ("SMT")).

Another important feature of the KGD module 400 is the package outline (i.e., the package form factor). The encapsulant 402 has peripheral walls that contact the leads 104 and form a first angle between the peripheral walls and the leads 104. More specifically the encapsulant 402 includes a mold cap that has a narrower-angled mold cap tapering dimension 404 (angle α (cf. angle β in FIG. 7)) as the first angle that is accordingly configured and optimized for die-stacking wirebond looping considerations and accommodation. Thus, as will be further described hereinbelow, PIP configurations can be readily accommodated, such as by attaching an additional semiconductor device on the KGD module 400. The narrower-angled mold cap tapering dimension 404 provides clearance for bond wires for the additional semiconductor device. Further, the bond wire clearance is within the same small dimensions of correspondingly dimensioned packages that do not have these features.

Figure 5:
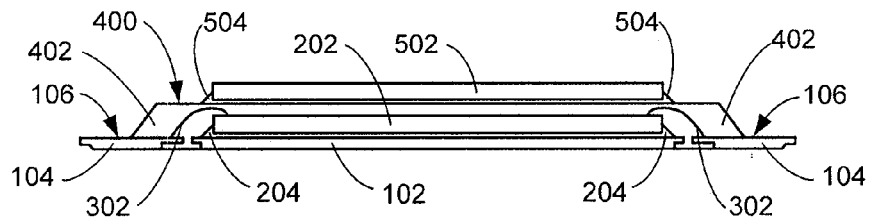
FIG. 5 is a view of a known good die module of the present invention employed as a substrate in the first stage of assembly of a package-in-package configuration according to an embodiment of the present invention.

Referring now to FIG. 5, therein is shown the KGD module 400 employed as a substrate in the first stage of the assembly of a PIP configuration according to one embodiment of the present invention. A second die 502 has been adhesively attached to the KGD module 400 by an adhesive 504, such as an epoxy adhesive. By attaching the second die 502 to the KGD module 400 in this manner, the KGD module 400 is, and functions as, a substrate for the second die 502.

Figure 6:
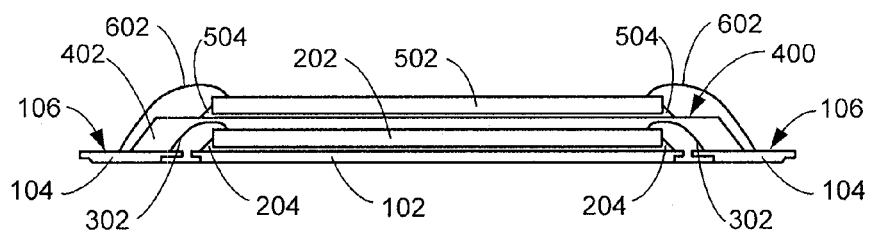
FIG. 6 is the structure of FIG. 5 after attachment thereto of bond wires between the second die and lead fingers on the known good die module's flange.

Referring now to FIG. 6, therein is shown the structure of FIG. 5 following attachment thereto of electrical conductors, such as bond wires 602, from the second die 502 to the elongated portion of the lead fingers 104 on the wide flange 106 of the KGD module 400. By virtue of the additional width dimension of the wide flange 106 and the lead fingers 104, the second die 502 is readily connected electrically to the KGD module 400 by the bond wires 602, notwithstanding the underlying encapsulant 402 that encapsulates the inner portion of the lead fingers 104. This is in contrast to conventional lead fingers and narrow leadframe flanges wherein the lack of space, lack of good surface finish, and irregular flange lead edges prevent further connection thereto.

Figure 7:
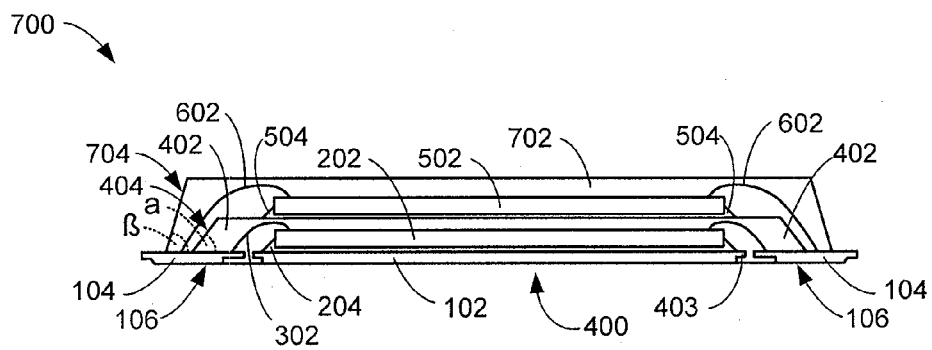
FIG. 7 is a view of the completed package-in-package configuration.

Referring now to FIG. 7, therein is shown a PIP configuration 700 according to one embodiment of the present invention. The PIP configuration 700 has been completed by encapsulating the structure of FIG. 6 in an additional encapsulant 702, providing thereby a very thin PIP solution that eliminates the need for separate substrates for each semiconductor device. The additional encapsulant 702 is formed directly contacting the second die 502, the bond wires 602, the encapsulant 402, and the lead fingers 104. The additional encapsulant 702 directly contacts and covers at least a portion of the too surface of the encapsulant 402. Alternatively, the additional encapsulant 702 completely encapsulates the encapsulant 402.

The additional encapsulant 702 has additional peripheral walls that form a second angle with either the top surface of the encapsulant 402 or the leads 104 at an angle different from the first angle. More specifically, the second angle includes a standard-angled mold cap tapering dimension 704 (angle β). The narrower-angled mold cap tapering dimension 404 (angle α) is smaller than the standard-angled mold cap tapering dimension 704 for accommodating and optimizing die-stacking wirebond looping considerations. For example, a standard QLP mold cap tapering dimension angle β is typically about 75°- 80°, Thus, as taught herein, for creating space for wirebonds (e.g., the bond wires 602), a lower angle α of approximately 30°-70°, for example, is provided.

Structures according to the present invention, such as the KGD module 400 (FIG. 4) and the PIP configuration 700, may be fabricated without difficulty using known processes and equipment. The DAP 102 is shown having the DAP extension 403 encapsulated in the encapsulant 402. As will readily be understood by one of ordinary skill in the art, these processes would include, for example, in-boat molding, in-boat die attach, and in-boat wire bonding. Other known technologies, of course, can be utilized, such as glob-top encapsulation processes.

Figure 8:
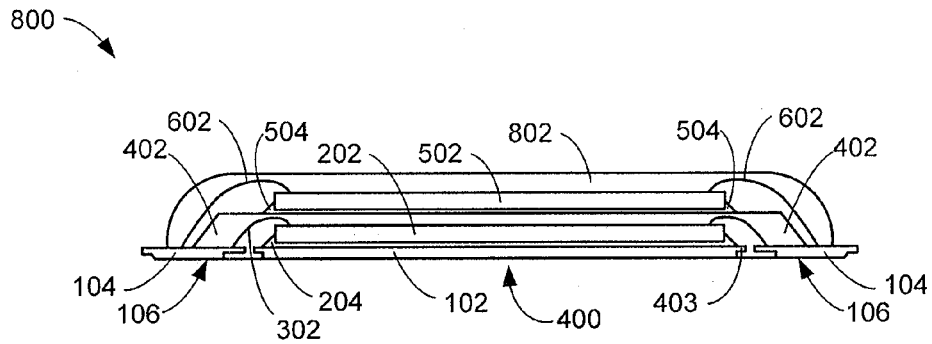
FIG. 8 is a view of a package-in-package configuration formed by glob-top encapsulation of the structure of FIG. 6.

Referring now to FIG. 8, therein is shown a PIP configuration 800 formed by glob-top encapsulation of the structure of FIG. 6. An encapsulant 802 has thus been applied to enclose and protect the second die 502 and the bond wires 602, in a manner similar to that performed by the additional encapsulant 702 (FIG. 7). The DAP 102 is further shown having the DAP encapsulated in the encapsulant 402.

While the structures and configurations that have been described are well suited, for example, for QLP applications, it will be appreciated that other interface configurations are sometimes desired. These would include, for example, ball grid arrays ("BGAs"), leaded packages (e.g., a quad flat pack ("QFP")), and so forth.

Figure 9:
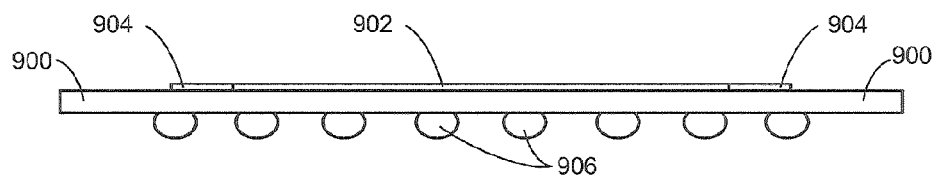
FIG. 9 is a view of a ball grid array substrate prepared for assembling a ball grid array package-in-package configuration in accordance with an embodiment of the present invention.

Referring now to FIG. 9, therein is shown a BGA substrate 900 prepared for assembling a BGA PIP configuration in accordance with an embodiment of the present invention. The BGA substrate 900 has an adhesive 902 applied in the center of the top thereof. Bondfingers 904 are positioned and spaced around the BGA substrate 900, outside the adhesive 902, for connection to the lead fingers of a KGD module, as will be described further hereinbelow. The bondfingers 904 are connected through the BGA substrate 900 to respective solder balls 906 on the bottom of the BGA substrate 900. The solder balls 906 form the BGA contact array.

Figure 10:
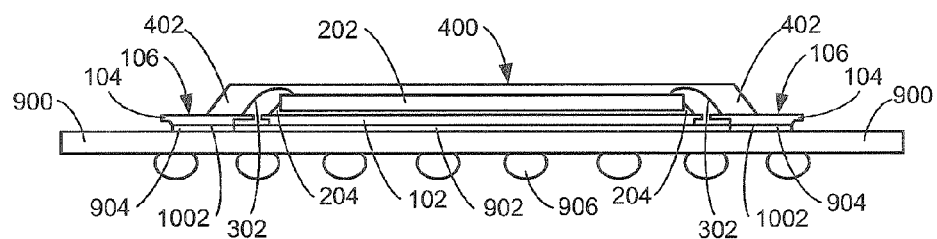
FIG. 10 is the structure of FIG. 9 after attachment thereto of a known good die module of the present invention.

Referring now to FIG. 10, therein is shown the structure of FIG. 9 following attachment thereto of a KGD module 400 of the present invention. The KGD module 400 is secured on the BGA substrate 900 by the adhesive 902, and the lead fingers 104 of the KGD module 400 are aligned with and connected to their corresponding bondfingers 904.

Alternatively, the adhesive 902 may be omitted and the KGD module 400 may be secured on the BGA substrate 900 by SMT solder 1002 between the bondfingers 904 and the lead fingers 104.

In yet another embodiment, the KGD module 400 may be secured on the BGA substrate 900 by both the adhesive 902 and the SMT solder 1002. This is advantageous as a solution to delamination, or a solution to voids potentially brought about by mold fillability issues in the narrow standoff space between the die 202 and the DAP 102.

Figure 11:
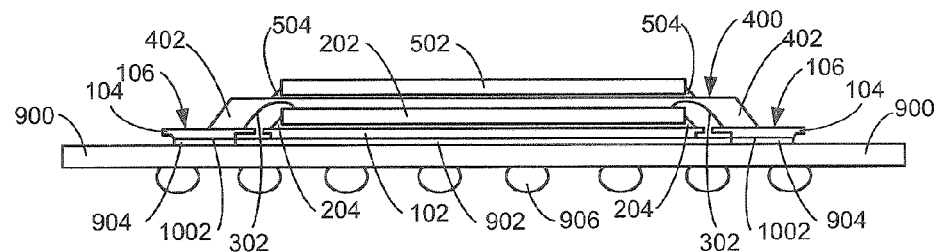
FIG. 11 is the structure of FIG. 10 after attachment thereto of a second die.

Referring now to FIG. 11, therein is shown the structure of FIG. 10 following attachment thereto of a second die 502, by means of an adhesive 504.

Figure 12:
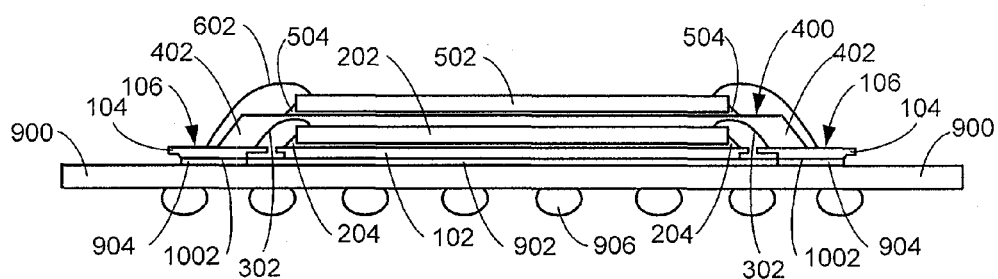
FIG. 12 is the structure of FIG. 11 after attachment thereto of bond wires between the second die and lead fingers on the known good die module's flange.

Referring now to FIG. 12, therein is shown the structure of FIG. 11 following attachment thereto of bond wires 602 between the second die 502 and the lead fingers 104 on the wide flange 106 of the KGD module 400.

Figure 13:
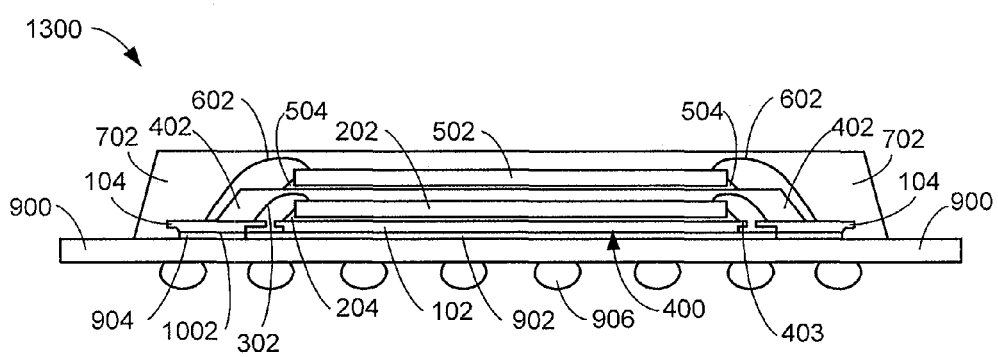
FIG. 13 is a view of the completed ball grid array package.

Referring now to FIG. 13, therein is shown a BGA package 1300 formed by completing the structure shown in FIG. 12 by encapsulating the elements on the top side of the BGA substrate 900 in an additional encapsulant 702. The DAP 102 is further shown having the DAP encapsulated in the encapsulant 402.

Figure 14:
FIG. 14 is a view of leads in the first stage in the fabrication of a leaded package-in-package configuration according to an embodiment of the present invention.

Referring now to FIG. 14, therein are shown leads 1400 having solder 1402 applied thereon. The leads 1400 are the first stage in the fabrication of a leaded PIP configuration, according to an embodiment of the present invention, that is advantageously facilitated by the wide flanges 106 (see FIG. 15).

Figure 15:
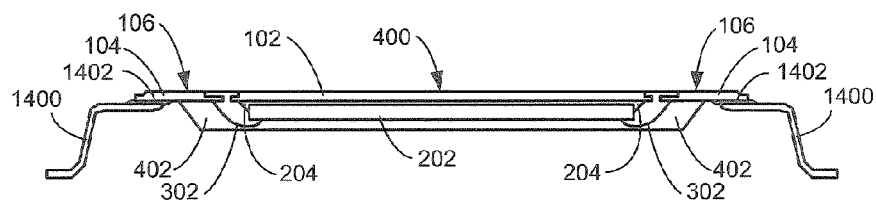
FIG. 15 is the structure of FIG. 14 after electrical attachment thereto of a known good die module of the present invention.

Referring now to FIG. 15, therein is shown the structure of FIG. 14 following the electrical attachment thereto, by means of the solder 1402, of a KGD module 400 of the present invention.

Figure 16:
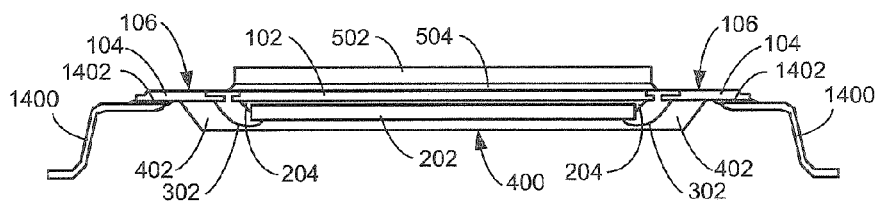
FIG. 16 is the structure of FIG. 15 after attachment thereto of a second die.

Referring now to FIG. 16, therein is shown the structure of FIG. 15 following the attachment thereto of a second die 502 by means of an adhesive 504 therebetween. In this embodiment, the second die 502 is attached to the KGD module 400 on the side of the DAP 102 opposite the die 202. Thus, the KGD module 400 functions as an effective substrate for the second die 502 regardless of the side of the KGD module 400 to which the second die 502 is attached.

Figure 17:
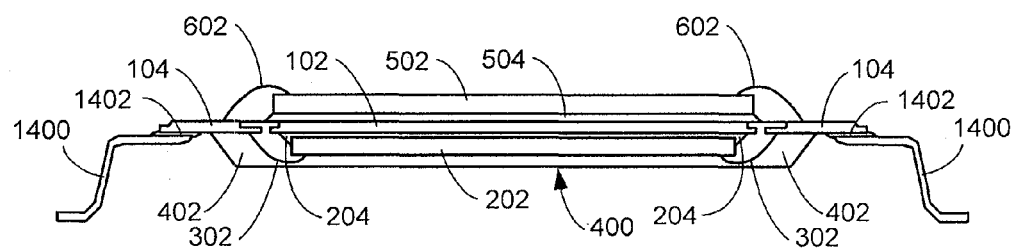
FIG. 17 is the structure of FIG. 16 after attachment thereto of bond wires between the second die and lead fingers on the known good die module's flange.

Referring now to FIG. 17, therein is shown the structure of FIG. 16 following attachment thereto of bond wires 602 between the second die 502 and the lead fingers 104 on the wide flange 106 of the KGD module 400.

Figure 18:
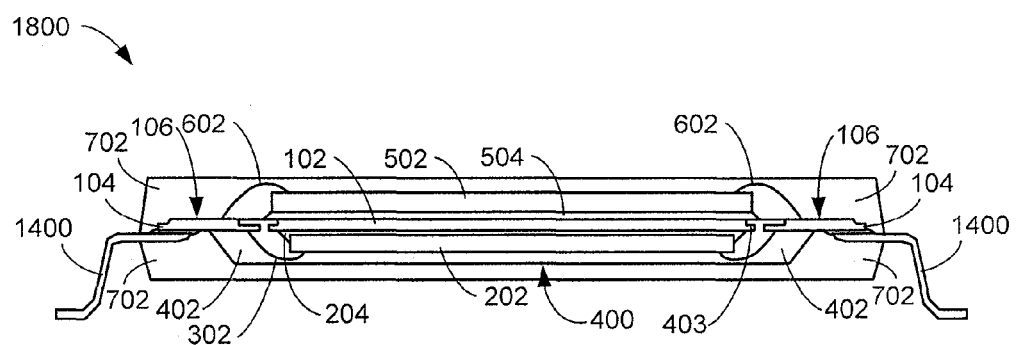
FIG. 18 is a view of the completed leaded package.

Referring now to FIG. 18, therein is shown a leaded package 1800 according to an embodiment of the present invention. The leaded package 1800 has been completed by encapsulating the structure of FIG. 17 in an additional encapsulant 702. The DAP 102 is further shown having the DAP extension 403 encapsulated in the encapsulant 402.

Referring now to FIG. 19, therein is shown a top view of the KGD module 400 (see FIG. 4). The elongated portion of the lead fingers 104 can extend from peripheral walls of the encapsulant 402. The lead fingers 104 are supported on the wide flange 106. The wide flange 106 can include lead supports 1902, as depicted by the enclosed regions between the elongated portion of the lead fingers 104 and as shown in other embodiments. The lead supports 1902 can extend between the elongated portion of the lead fingers 104 extending from the peripheral walls of the encapsulation 402. A side of the lead supports 1902 exposed from and facing away from the peripheral walls of the encapsulation 402 can be coplanar with a side of the elongated portion of the lead fingers 104 exposed from and facing away from the peripheral walls of the encapsulation 402. The lead supports 1902 can be made from non-conductive material to prevent shorting of the lead fingers 104.

Referring now to FIG. 20, therein is shown a KGD module 2000 according to another embodiment of the present invention. The KGD module 2000 is a single-sided module. That is, the KGD module 2000 has a wide flange 106 along only one side thereof, unlike the KGD module 400 (FIG. 19), which is dual-sided.

Referring now to FIG. 21, therein is shown a KGD module 2100 that is a four-sided module having wide flanges 106 on all four sides thereof according to still another embodiment of the present invention.

Figure 22:
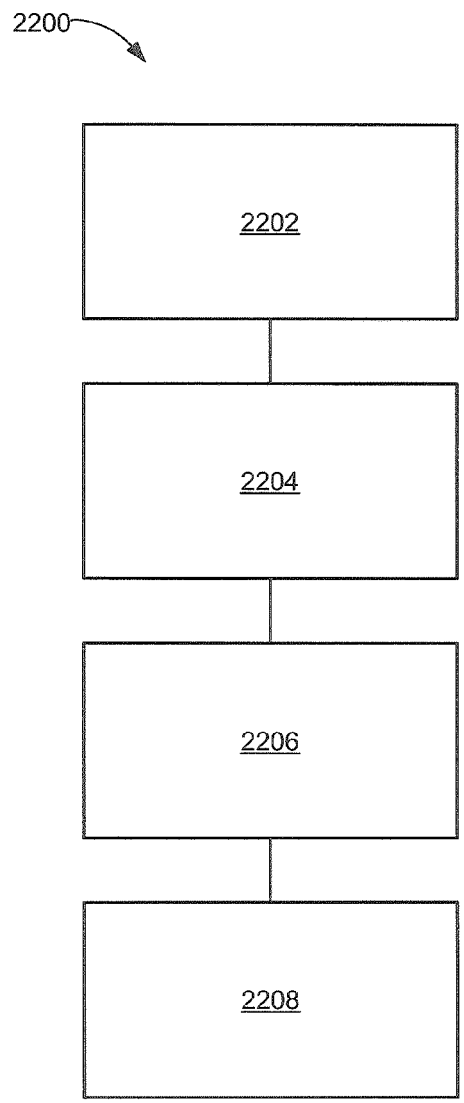
FIG. 22 is a flow chart of a system for thin package-in-package configurations in accordance with an embodiment of the present invention.

Referring now to FIG. 22, therein is shown a flow chart of an integrated circuit package system 2200 in accordance with an embodiment of the present invention. The system 2200 includes providing a known good die module by providing a leadframe, providing a first die, attaching the first die to the leadframe, and encapsulating at least the first die, in a block 2202; attaching a second die to the known good die module such that the known good die module is a substrate for the second die, in a block 2204; electrically attaching the second die to the known good die module, in a block 2206; and additionally encapsulating at least the second die, in a block 2208.

It has been discovered that the present invention thus has numerous advantages.

A principle advantage that has been unexpectedly discovered is that the present invention readily provides an economical and versatile solution for the pressing need for improved methods and structures to meet and match the ever-reducing external form factors of ever more complex packaged semiconductor devices.

Another particular advantage of the present invention is the substantially reduced thicknesses of package-in-package ("PIP") configurations, along with the simplification thereof, that are provided.

Another advantage is the improved PIP reliability afforded by the present invention.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the system for thin PIP configurations of the present invention furnishes important and heretofore unknown and unavailable solutions, capabilities, and functional advantages for configuring, fabricating, and assembling high performance, small profile, small form factor IC packages. The resulting processes and configurations are straightforward, cost-effective, uncomplicated, highly versatile and effective, can be implemented by adapting known technologies, and are thus readily suited for efficiently and economically manufacturing PIP semiconductor device configurations.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for fabricating an integrated circuit package comprising: providing a known good die module by: providing a leadframe having a first lead finger, second lead finger, and a die attach pad with a die attach pad extension, the die attach pad between the first lead finger and the second lead finger; adhesively attaching a first die to one side of the die attach pad of the leadframe; attaching a first set of bond wires between the first die and the first lead finger of the leadframe, and a second set of bond wires between the first die and the second lead finger of the leadframe; encapsulating at least the first die, the first set of bond wires attached thereto, the second set of bond wires attached thereto, the die attach pad, the die attach pad extension, and portions of the first lead finger and the second lead finger with a first encapsulant, wherein each of the first lead finger and the second lead finger has an elongated portion extending from peripheral walls of the first encapsulant; and forming lead supports extending between adjacent the elongated portions of the first lead finger and the second lead finger; adhesively attaching a second die to the known good die module, the second die on the same side of the die attach pad of the leadframe as the first die the second die being substantially similar in size as the first die; attaching a third set of bond wires from the second die to the elongated portion of the first lead finger of the leadframe, the third set of bond wires adjacent the first set of bond wires and directly contacting the same side of the first lead finger thereof; attaching a fourth set of bond wires from the second die to the elongated portion of the second lead finger of the leadframe, the fourth set of bond wires adjacent the second set of bond wires and directly contacting the same side of the second lead finger thereof; and encapsulating at least the second die, the third set of bond wires attached thereto, the fourth set of bond wires attached thereto, and portions of the first lead finger and the second lead fing.er, with a second encapsulant.

2. The method as claimed in claim 1 wherein providing the leadframe further comprises providing the leadframe having at least one wide flange on at least one, two, or four sides thereof.

3. The method as claimed in claim 1 further comprising attaching the leadframe to:
   a ball grid array substrate; or
   leads configured for forming a leaded package.

4. The method as claimed in claim 1 wherein encapsulating at least the first die, the first set of bond wires attached thereto, and the second set of bond wires attached thereto, with the first encapsulant, further comprises forming a mold cap having a narrower-angled mold cap tapering dimension configured for die-stacking wirebond looping accommodation.

5. An integrated circuit package comprising: a known good die module having: a leadframe having a first lead finger and second lead finger, wherein each of the first lead finger and the second lead finger includes an elongated portion; and a die attach pad with a die attach pad extension, the die attach pad between the first lead finger and the second lead finger; a first die attached to one side of the die attach pad of the leadframe; a first set of bond wires attached between the first die and the first lead finger of the leadframe, and a second set of bond wires between the first die and the second lead finger of the leadframe; a first encapsulant having peripheral walls and encapsulating at least the first die, the first set of bond wires attached thereto, the second set of bond wires attached thereto, the die attach pad, the die attach pad extension, and portions of the first lead finger and the second lead finger with the elongated portions of the first lead finger and the second lead finger extending from the peripheral walls; and lead supports adjacent the elongated portions of the first lead finger and the second lead finger; a second die attached directly on the known good die module, the second die on the same side of the die attach pad of the leadframe as the first die the second die being substantially similar in size as the first die; a third set of bond wires attached from the second die to the elongated portion of the first lead finger of the leadframe, the third set of bond wires adjacent the first set of bond wires and directly contacting the same side of the first lead finger thereof; a fourth set of bond wires attached from the second die to the elongated portion of the second lead finger of the leadframe, the fourth set of bond wires adjacent the second set of bond wires and directly contacting the same side of the second lead finger thereof; and a second encapsulant encapsulating at least the second die, the third set of bond wires attached thereto, the fourth set of bond wires attached thereto, and portions of the first lead finger and the second lead finger.

6. The package as claimed in claim 5 wherein the leadframe further comprises the leadframe having at least one wide flange on at least one, two, or four sides thereof.

7. The package as claimed in claim 5:
   further comprising:
      a ball grid array substrate; or
      leads for a leaded package; and
   wherein the leadframe is attached to the ball grid array substrate or the leads for a leaded package.

8. The package as claimed in claim 5 wherein the first encapsulant encapsulating at least the first die, the first set of bond wires attached thereto, and the second set of bond wires attached thereto, further comprises a mold cap having a narrower-angled mold cap tapering dimension configured for die-stacking wirebond looping accommodation.

* * * * *

UNITED STATES PATENT AND TRADEMARK OFFICE
CERTIFICATE OF CORRECTION

PATENT NO. : 8,698,294 B2  Page 1 of 1
APPLICATION NO. : 11/307129
DATED : April 15, 2014
INVENTOR(S) : Camacho et al.

It is certified that error appears in the above-identified patent and that said Letters Patent is hereby corrected as shown below:

In the Specification:

1. Column 4, line 9, delete ""side"(as in "sidewall"), "higher", "lower", "lupper","over"," and insert therefor --"side" (as in "sidewall"), "higher", "lower", "upper", "over","--

2. Column 6, line 35, delete "of the too" and insert therefor --of the top--

In the Claims:

3. Column 9, claim 1, line 61, delete "lead fing.er, with" and insert therefor --lead finger, with--

Signed and Sealed this
Third Day of May, 2016

Michelle K. Lee
*Director of the United States Patent and Trademark Office*